(12) United States Patent
Ma

(10) Patent No.: US 8,741,506 B2
(45) Date of Patent: Jun. 3, 2014

(54) MASK AND REPAIRING METHOD THEREFOR

(75) Inventor: Jiaxing Ma, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/638,081

(22) PCT Filed: Jul. 16, 2012

(86) PCT No.: PCT/CN2012/078669
§ 371 (c)(1),
(2), (4) Date: Sep. 28, 2012

(87) PCT Pub. No.: WO2013/185401
PCT Pub. Date: Dec. 19, 2013

(65) Prior Publication Data
US 2013/0337371 A1    Dec. 19, 2013

(30) Foreign Application Priority Data
Jun. 15, 2012 (CN) .......................... 2012 1 0199257

(51) Int. Cl.
*G03F 1/72*    (2012.01)

(52) U.S. Cl.
CPC ........................................ *G03F 1/72* (2013.01)
USPC ................................. 430/5; 430/22; 430/30

(58) Field of Classification Search
CPC ........................................................ G03F 1/72
USPC ........................... 430/5, 22, 30, 323, 324, 394
See application file for complete search history.

(56) References Cited

U.S. PATENT DOCUMENTS

| | | | |
|---|---|---|---|
| 4,340,654 A | 7/1982 | Campi | |
| 7,771,899 B2 | 8/2010 | Lee | |
| 2004/0224238 A1 | 11/2004 | Chin et al. | |

FOREIGN PATENT DOCUMENTS

| | | |
|---|---|---|
| CN | 101105622 | 1/2008 |
| CN | 101154029 | 4/2008 |
| CN | 101344720 | 1/2009 |
| CN | 101419399 | 4/2009 |
| CN | 101685254 | 3/2010 |
| EP | 0961168 | 12/1999 |
| WO | 8103628 | 12/1981 |

*Primary Examiner* — Christopher Young
(74) *Attorney, Agent, or Firm* — Kirton McConkie; Evan R. Witt

(57) ABSTRACT

The present invention provides a mask and a repairing method therefor. A reference area is selected in a configuration pattern of a mask template, the reference area is corresponding to a to-be-shaded area of a mask; a repair area is formed on a drillable member according to the reference area; a hollow area is formed in the repair area of the drillable member, the hollow area is corresponding to the to-be-shaded area; the drillable member is attached to the mask, the hollow area is corresponding to the to-be-shaded area; and shading material is coated on the drillable member, so as to form a shaded layer on the to-be-shaded layer.

14 Claims, 11 Drawing Sheets

MASK AND REPAIRING METHOD THEREFOR

FIELD OF THE INVENTION

The present invention relates to a technical field of liquid crystal display, and more particularly to a mask and a repairing method therefor.

BACKGROUND OF THE INVENTION

With the continuous development of LCD (Liquid Crystal Display) technology, there are strict demands on production efficiency of LCD.

In LCD production, the mask is an essential fabrication tool, for instance, while manufacturing a pixel region of the substrate of TFT (Thin Film Transistor), or a photo resistor region of the substrate of CF (Color Filter), it needs to use the mask. However, in the present technology, the manufacture of mask needs a long period and high price, for example, the cost of each mask is over one million CNY.

Referring now to FIG. 1, FIG. 1 is a structural top view of a traditional mask. FIG. 2 is a partially cross-sectional view of FIG. 1.

As shown in FIG. 1, a mask 10 comprises a transparent glass 11, a chromium layer 12 stacked on the transparent glass 11, a transparent area 13 located at the same level of the chromium layer 12 and formed between the chromium layer 12, wherein the chromium layer 12 is opaque, the chromium layer 12 and the transparent area 13 commonly form a mask pattern.

The mask 10 is used frequently and easy to be damaged, and sometimes, a mask pattern of the mask 10 must be adjusted, for example, widening the chromium layer 12. In both of the foregoing situations, it needs to repair the mask 10 by sending back to a maintenance place and re-coating, wherein a chromium layer is coated on a damaged or to-be-widened part. However, it needs a long repairing period, high price, and thus affects production efficiency of LCD.

As described above, it is necessary to solve the problems of the existing mask repairing technology that needs long repairing period, high price, and affects production efficiency of LCD.

SUMMARY OF THE INVENTION

A primary object of the present invention is to provide a repairing method for a mask, to solve the problems of the existing technology that needs high price of repairing mask, a long repairing period, and affects production efficiency of LCD.

To achieve the above object, the present invention provides a repairing method for a mask, which comprises steps of:

providing a drillable member, a mask, a mask template, a print board and a photoresist layer, wherein the mask comprises a to-be-shaded area, the mask template comprises a configuration pattern, the shape of the configuration pattern is the same as the shape of a mask pattern of the mask before forming the to-be-shaded area;

selecting a reference area in the configuration pattern of the mask template, the reference area being corresponding to the to-be-shaded area of the mask; forming a printed area on the print board according to the selected reference area of the mask template, a pattern shape of the printed area being the same as that of the reference area, and the printed area having the same proportion as the mask pattern of mask; attaching the print board to the drillable member, and imprinting the printed area onto the drillable member to form a repair area on the drillable member, and a pattern of the repair area having the same proportion as the mask pattern of the mask;

forming a hollow area by hollowing the repair area of the drillable member, wherein the hollow area is corresponding to the to-be-shaded area of the mask;

attaching the drillable member having the hollow area onto the mask, wherein the hollow area is corresponding to the to-be-shaded area;

coating a shading material onto the drillable member having the hollow area, so as to form a shaded layer on the to-be-shaded area;

exposing a photoresist layer by the mask having the shaded layer, and developing the photoresist layer; and checking if the photoresist layer corresponding to the shaded layer is etched; if the photoresist layer corresponding to the shaded layer is etched, returning to repair the mask.

In the repairing method for a mask of the present invention, after providing the mask having the to-be-shaded area, the method further comprises steps of:

selecting positioning areas in the to-be-shaded area;

wherein when forming the hollow area by hollowing the repair area of the drillable member, further comprising:

forming alignment portions on the drillable member, wherein the alignment portions are corresponding to the positioning areas of the mask;

wherein when attaching the drillable member having the hollow area onto the mask, further comprising:

aligning the alignment portions of the drillable member with the positioning areas of the mask, so that the hollow area of the drillable member is aligned with the to-be-shaded area of the mask.

In the repairing method for a mask of the present invention, the mask is formed with four of the positioning areas which defines a square area, and the four positioning areas are located at four corners of the square area, respectively;

wherein the drillable member is square, the drillable member is formed with four of the alignment portions, and the four alignment portions are located at four corners of the drillable member;

when the alignment portions of the drillable member are aligned with the positioning areas of the mask, the alignment portions and the positioning areas are positioned by light and a magnifying glass.

In the repairing method for a mask of the present invention, the shading material is black ink.

In the repairing method for a mask of the present invention, the to-be-shaded area is a to-be-repaired flaw on the mask.

In the repairing method for a mask of the present invention, the to-be-shaded area is a to-be-expanded shaded area on the mask.

Another object of the present invention is to provide a repairing method for a mask, to solve the problems of the existing technology that needs high price of repairing mask, a long repairing period, and affects production efficiency of LCD.

To achieve the above object, the present invention provides a repairing method for a mask, which comprises steps of:

providing a drillable member, a mask and a mask template, wherein the mask comprises a to-be-shaded area, the mask template comprises a configuration pattern, the shape of the configuration pattern is the same as the shape of a mask pattern of the mask before forming the to-be-shaded area;

selecting a reference area in the configuration pattern of the mask template, the reference area being corresponding to the to-be-shaded area of the mask; and forming a repair area on the drillable member according to a pattern of the reference area, a pattern of the repair area having the same proportion as the mask pattern of mask;

forming a hollow area by hollowing the repair area of the drillable member, wherein the hollow area is corresponding to the to-be-shaded area of the mask;

attaching the drillable member having the hollow area onto the mask, wherein the hollow area is corresponding to the to-be-shaded area; and coating a shading material onto the drillable member having the hollow area, so as to form a shaded layer on the to-be-shaded area.

In the repairing method for a mask of the present invention, the step of forming the repair area on the drillable member according to a pattern of the reference area, the method further comprises steps of:

providing a print board;

forming a printed area on the print board according to the selected reference area of the mask template, a pattern shape of the printed area being the same as that of the reference area, and the printed area having the same proportion as the mask pattern of mask; and attaching the print board onto the drillable member, and imprinting the printed area onto the drillable member to form the repair area on the drillable member.

In the repairing method for a mask of the present invention, after providing the mask having the to-be-shaded area, the method further comprises steps of:

selecting positioning areas in the to-be-shaded area:

wherein when forming the hollow area by hollowing the repair area of the drillable member, further comprising:

forming alignment portions on the drillable member, wherein the alignment portions are corresponding to the positioning areas of the mask;

wherein when attaching the drillable member having the hollow area onto the mask, further comprising:

aligning the alignment portions of the drillable member with the positioning areas of the mask, so that the hollow area of the drillable member is aligned with the to-be-shaded area of the mask.

In the repairing method for a mask of the present invention, the mask is formed with four of the positioning areas which defines a square area, and the four positioning areas are located at four corners of the square area, respectively;

wherein the drillable member is square, the drillable member is formed with four of the alignment portions, and the four alignment portions are located at four corners of the drillable member;

when the alignment portions of the drillable member are aligned with the positioning areas of the mask, the alignment portions and the positioning areas are positioned by light and a magnifying glass.

In the repairing method for a mask of the present invention, the shading material is black ink.

In the repairing method for a mask of the present invention, the to-be-shaded area is a to-be-repaired flaw on the mask.

In the repairing method for a mask of the present invention, the to-be-shaded area is a to-be-expanded shaded area on the mask.

In the repairing method for a mask of the present invention, after coating the shading material onto the drillable member to form the shaded layer, the method further comprises steps of:

providing a photoresist layer;

exposing a photoresist layer by the mask having the shaded layer, and developing the photoresist layer; and checking if the photoresist layer corresponding to the shaded layer is etched; if the photoresist layer corresponding to the shaded layer is etched, returning to repair the mask.

Another object of the present invention is to provide a mask, to solve the problems of the existing technology that needs high price of repairing mask, a long repairing period, and affects production efficiency of LCD.

To achieve the above object, the present invention provides a mask which comprises a first shaded area and a second shaded area, wherein the first shaded area is formed by a first shading material, the second shaded area is formed by a second shading material, wherein the second shaded area is formed after forming the first shaded area.

In the mask of the present invention, the second shaded area is black ink.

The mask of the present invention comprises a to-be-shaded area, for example, the to-be-shaded area is a to-be-repaired flaw or a to-be-expanded shaded area, the present invention forms a hollow area on the drillable member by enlarging a pattern of the mask template corresponding to the to-be-shaded area onto the drillable member, wherein the hollow area is corresponding to the to-be-shaded area of the mask; the drillable member is then attached onto the mask, so that the hollow area is aligned with the to-be-shaded area of the mask; and a shading material is coated onto the drillable member, so that the shading material is filled into the to-be-shaded area to form a shaded layer on the to-be-shaded area. Apparently, the present invention provides lower price, shorter repairing period, and higher efficiency of repairing.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Figure 1:
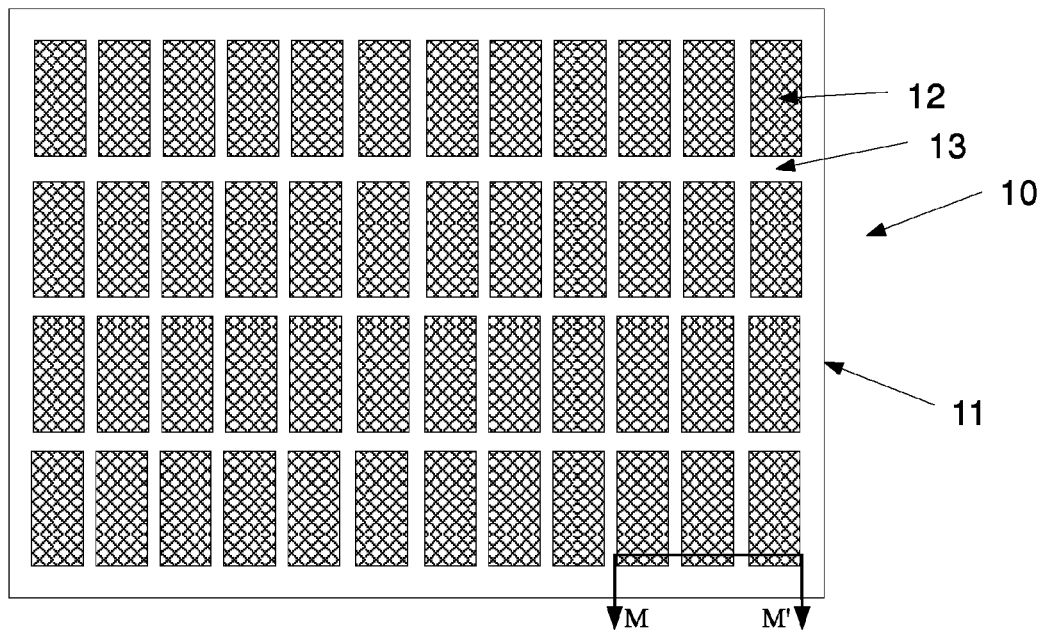
FIG. 1 is a structural top view of a traditional mask.
Figure 2:
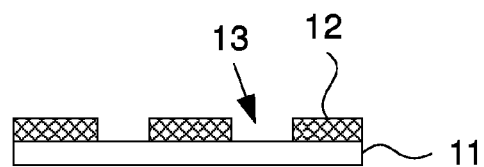
FIG. 2 is a cross-sectional view along line M-M' of FIG. 1.
Figure 3:
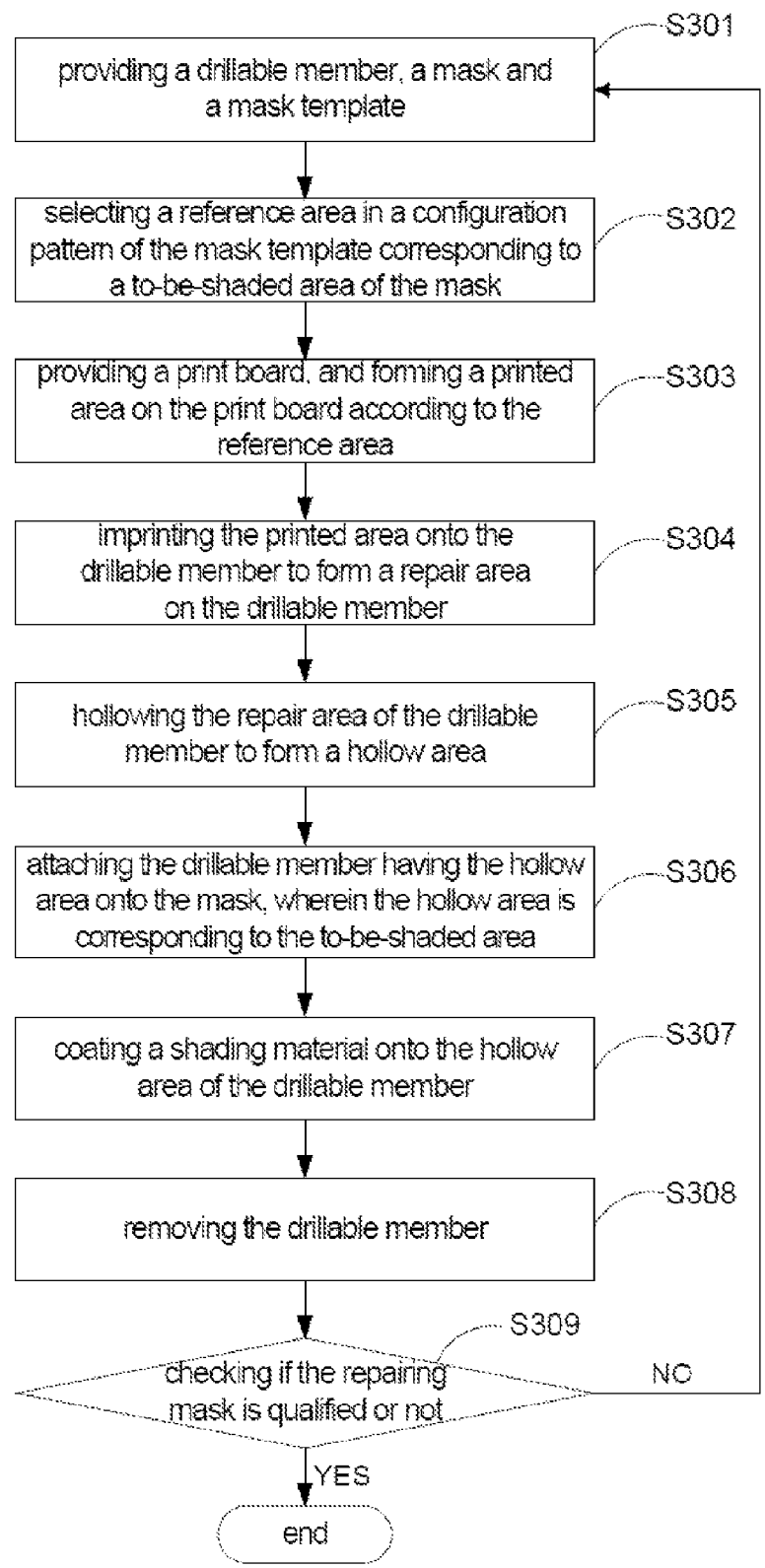
FIG. 3 is a flowchart of a repairing method for a mask according to a preferred embodiment of the present invention.
Figure 4A:
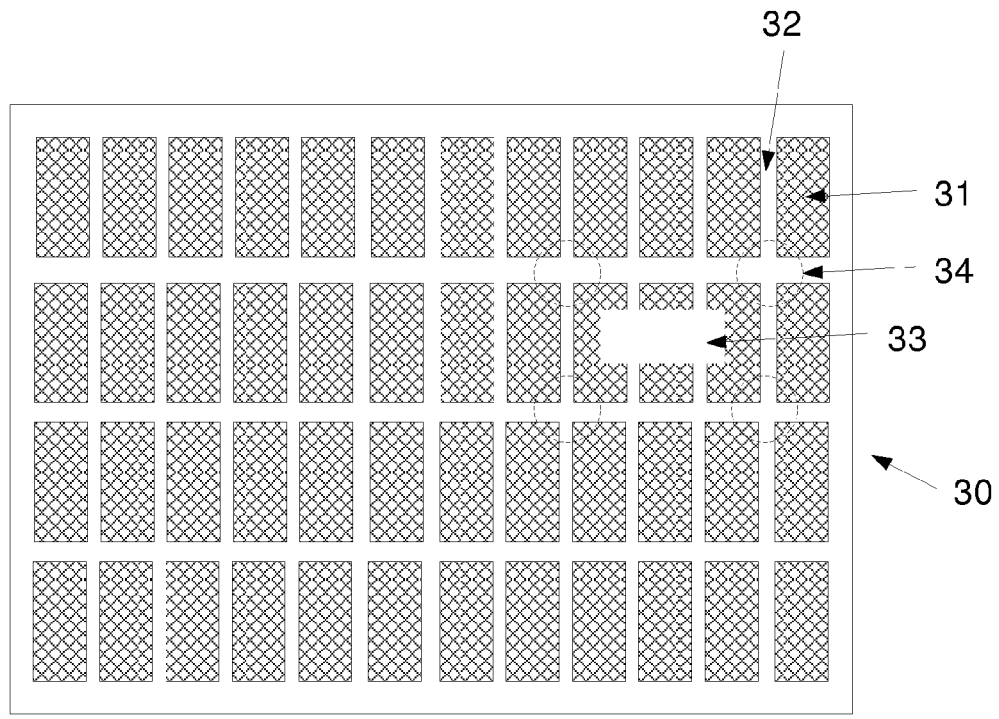
FIG. 4A-4I are structural schematic views of repairing the mask of FIG. 3.
Figure 4B:
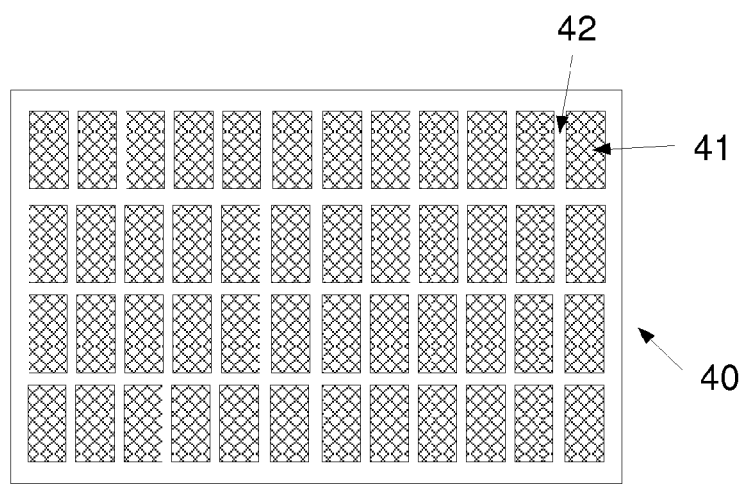
Figure 4C:
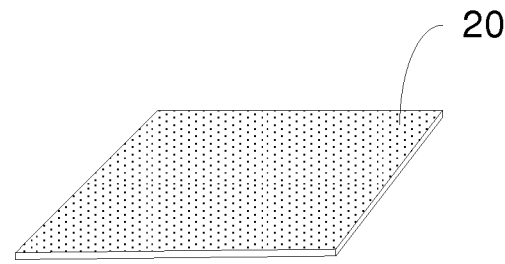

FIG. 3 is a flowchart of a repairing method for a mask according to a preferred embodiment of the present invention;

In the step (S301), providing a drillable member 20, a mask 30 and a mask template 40, referring together to FIGS. 4A, 4B and 4C.

The mask 30 in FIG. 4A comprises a to-be-shaded area 33, the to-be-shaded area 33 is a to-be-repaired flaw on the mask 30, wherein the to-be-repaired flaw is generated by using the mask 30 or producing the mask 30. The existence of the to-be-repaired flaw causes a flaw on a substrate (such as a TFT substrate) made by the mask 30, and thus affects the yield of product.

Figure 4D:
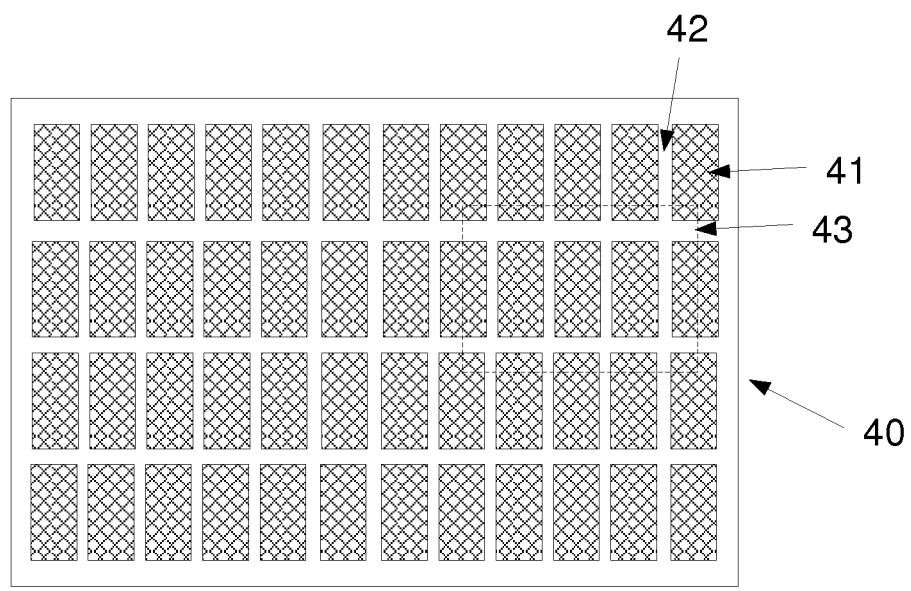

In the step (S302), selecting a reference area 43 in the configuration pattern of the mask template 40, wherein the reference area 43 is corresponding to the to-be-shaded area 33 of the mask 30, referring together to FIGS. 4A and 4D. The reference area 43 is corresponding to a square area of the mask 30 defined by four of the positioning areas 34.

Figure 4E:
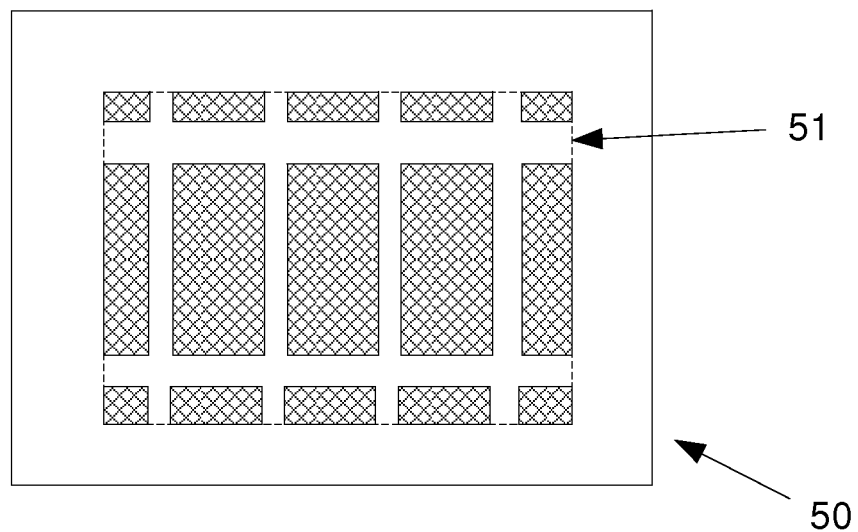

In the step (S303), providing a print board 50, and forming a printed area 51 on the print board 50 according to the reference area 43, wherein the printed area 51 has the same proportion as the mask pattern of mask 30, referring to FIG. 4E.

Figure 4F:
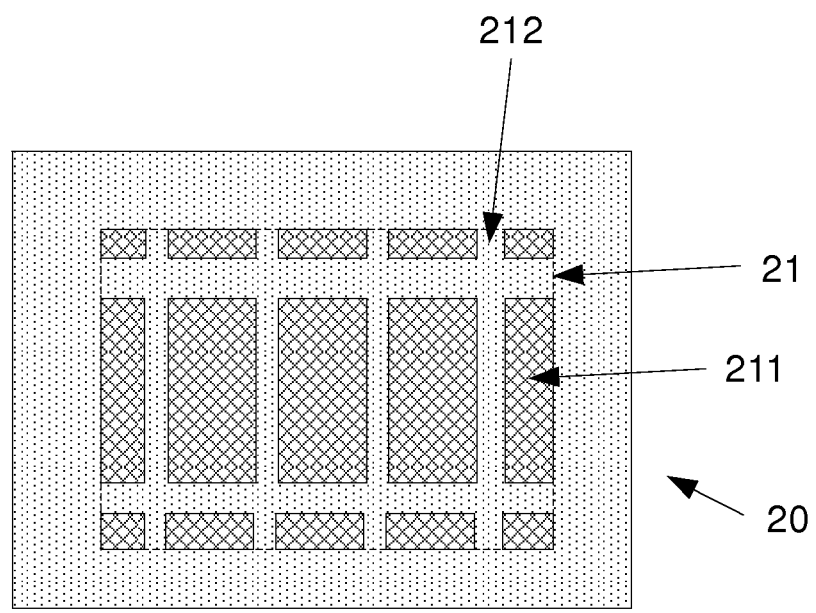

In the step (S304), imprinting the printed area 51 onto the drillable member 20 to form a repair area 21 on the drillable member 20, wherein a pattern of the repair area 21 has the same proportion as the mask pattern of mask 30, referring to FIG. 4F.

Figure 4G:
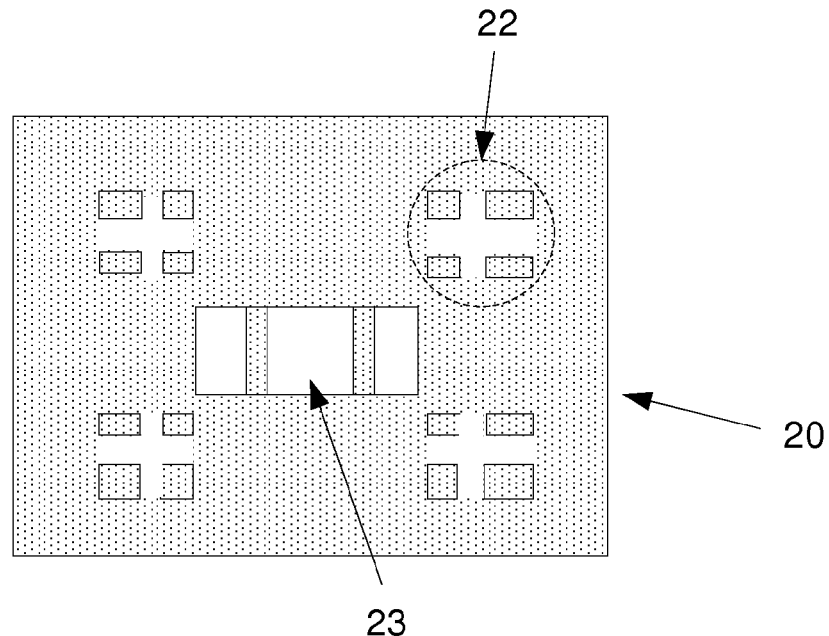

In the step (S305), hollowing the drillable member 20 to form a hollow area 23 on the repair area 21, and simultaneously forming four alignment portions 22, referring to FIG. 4G.

Figure 4H:
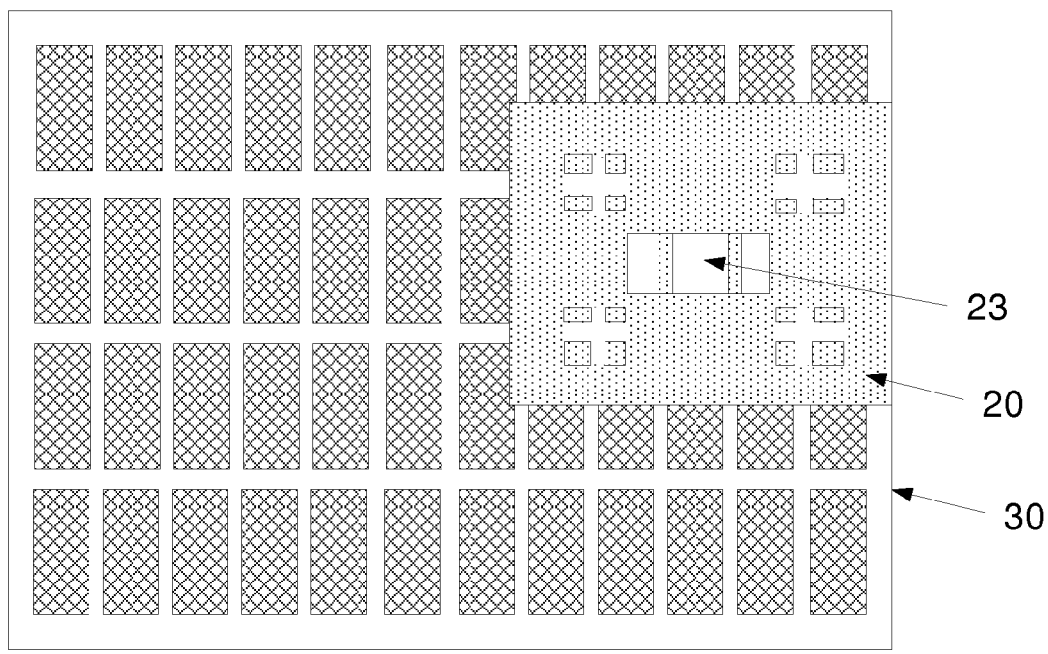

In the step (S306), attaching the drillable member 20 having the hollow area 23 onto the mask 30, so that the hollow area 23 is aligned with the to-be-shaded area 33, referring to FIG. 4H.

In the step (S307), coating a shading material onto the drillable member 20 having the hollow area 23.

The shading material is preferably black ink, wherein an advantage of black ink is low price and cost down. Surely, it also can be other shading material, but not described detailed herein.

Figure 4I:
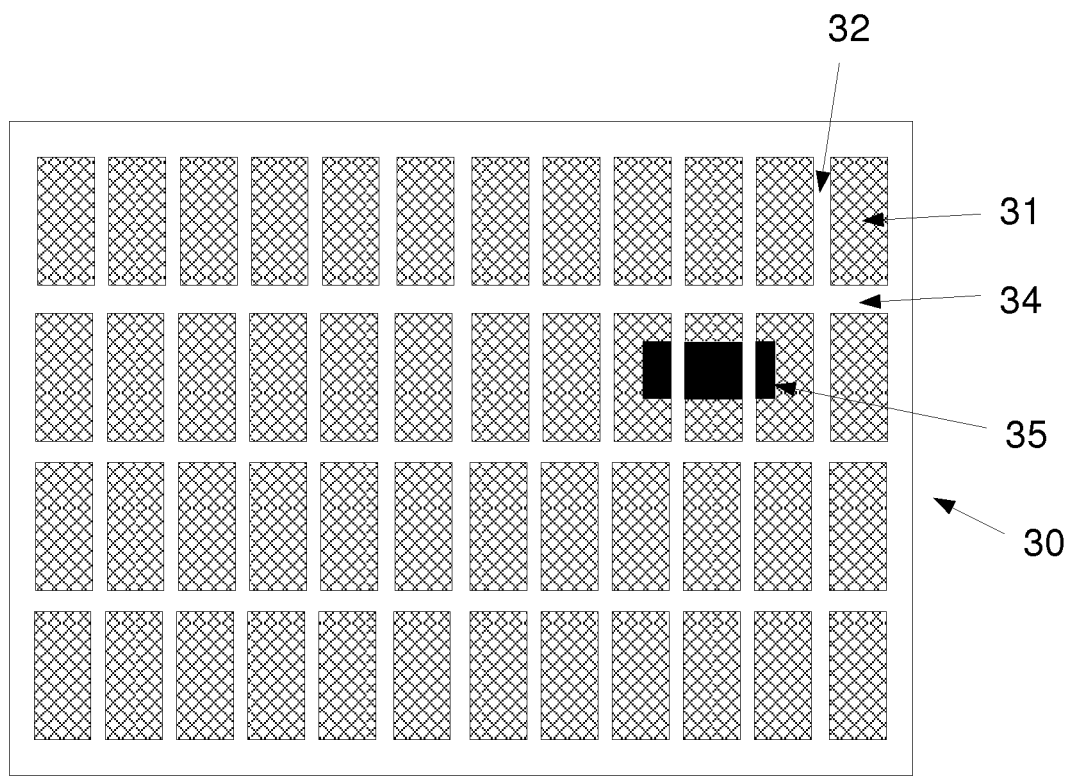

In the step (S308), removing the drillable member 20, referring to FIG. 4I, and forming a shaded layer 35 on the to-be-shaded area 33 by coating a shading material.

In the step (S309), exposing a photoresist layer by the mask 30 having the shaded layer 35, and developing the photoresist layer; checking if the photoresist layer corresponding to the shaded layer 35 is etched; if the photoresist layer corresponding to the shaded layer 35 is not etched, it means that the repairing is successful; if the photoresist layer is etched, it means that the repairing is failed, and thus returning to the step (S301).

In the FIG. 4A, the mask 30 comprises a shaded area 31, a transparent area 32, a to-be-shaded area 33 and positioning areas 34 selected according to the to-be-shaded area 33, wherein the shaded area 31 is used to block the light in a process of mask; the light passes through the transparent area 32 in the process of mask; the photoresist layer corresponding the shaded area 31 is not exposed to the light and can be kept during developing; the photoresist layer corresponding the transparent area 32 is exposed to the light and reacts therein, and thus it can be etched during developing.

Referring to FIG. 4A again, for repairing the to-be-shaded area 33 more accurately, the present invention selects positioning areas 34 which defines a square area, the four positioning areas 34 are located at four corners of the square area, respectively, the positioning areas 34 are used to accurately position the to-be-shaded area 33, wherein each of the positioning area 34 comprises a first positioning pattern, the first positioning pattern comprises four corners of four annularly adjoined shaded areas 31 and a transparent area 32 which is surrounded by the four shaded areas 31. Surely, the positioning areas 34 can be selected in other forms which can be accurately aligned with the to-be-shaded area 33, but not described detailed herein.

Referring to FIG. 4B, the mask template 40 comprises a configuration pattern, the shape of the configuration pattern is the same as the shape of a mask pattern of the mask 30 before forming the to-be-shaded area 33, wherein the difference therebetween is that the configuration pattern of the mask template 40 has different proportion from the mask pattern of the mask 30, for example, the ratio of the configuration pattern of the mask template 40 and the mask pattern of the mask 30 can be 1:5, Surely, the configuration pattern of the mask template 40 can also have the same proportion as the mask pattern of the mask 30 for easily imprinting the mask template 40. The mask pattern of the mask 30 is formed by the shaded areas 31 and a transparent area 32.

Referring still to FIG. 4B, the mask template 40 comprises: a shaded mark area 41 which is used to mark the shaded area 31 of the mask 30, and a transparent mark area 42 which is used to mark the transparent area 32 of the mask 30.

Referring to FIG. 4C, the drillable member 20 is preferably a square, the size of the square is the same as that of a square area defined by four of the positioning areas 34 of the mask 30, the drillable member 20 is preferably a transparent film, and also can be other materials, for example, a sheet easy to be cut, but not described detailed herein.

Referring to FIG. 4E, the size of the printed area 51 is the same as that of a square area defined by four of the positioning areas 34 on the mask 30, wherein the print board 50 can be a normal paper on which the reference area 43 can be easily expanded and imprinted, but not described detailed herein.

Referring to FIG. 4F, a pattern of the repair area 21 has the same shape and size as a pattern of the printed area 51, wherein the repair area 21 comprises shaded repair areas 211 and a transparent repair area 212.

Certainly, in one embodiment, the printed area 51 can be directly expanded to the drillable member 20 to form the repair area 21, it can omit the print board 50 in the step (S303), and thus carry out cost down.

Referring to FIG. 4G, the hollow area 23 is corresponding to the to-be-shaded area 33, and four of the alignment portions 22 is aligned with the positioning areas 34, wherein each of the alignment portions 22 comprises a second positioning pattern, the size and shape of the second positioning pattern is the same as that of the first positioning pattern of the positioning area 34 of the mask 30.

Referring to FIG. 4H, when attaching the drillable member 20 having the hollow area 23 onto the mask 30, the four alignment portions 22 are aligned with the four positioning areas 34 of the mask 30, so that the hollow area 23 is aligned to the to-be-shaded area 33.

More specifically, when attaching the drillable member 20 having the hollow area 23 onto the mask 30, four corners are positioned by light and a magnifying glass, so that four of the alignment portions 22 of the drillable member 20 are aligned with four of the positioning areas 34 of the mask 30, respectively, wherein the hollow area 23 and the to-be-shaded area 33 are accurately positioned.

Certainly, the repairing method for a mask of the present invention is not limited to repair a flaw. It also can repair a to-be-expanded shaded area of the mask, for example, referring to FIGS. 5A to 5C.

Figure 5A:
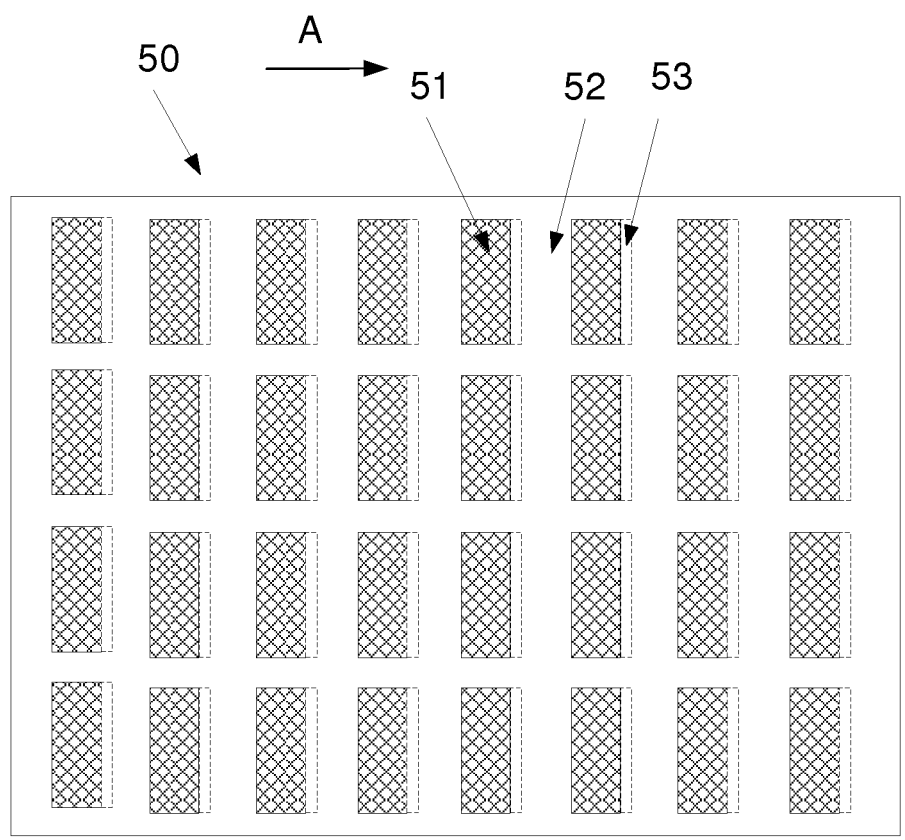
FIG. 5A-5C are structural schematic views of repairing the mask according to another embodiment of the present invention.

In the FIG. 5A, a mask 50 comprises a shaded area 51 and a transparent area 52, wherein the shaded area 51 (i.e. to-be-shaded areas 53 in FIG. 5A) needs to be widened along a direction A due to the requirements of the product. In this case, if the mask 50 is send back to a maintenance place for expanding, it will exist the problems of high price and a long repair period. Instead, the repairing method for a mask of the present invention can be used to avoid the problems.

As described above, firstly providing a drillable member 60 and a mask template (not shown), wherein a mask template is a specification of the mask 50, the shape of a configuration pattern of the mask template is the same as the shape of a mask pattern of the mask 50. Then, magnifying the configuration pattern of the mask template and imprinting onto the drillable member 60, followed by hollowing the drillable member 60 to form a hollow area 61, for example, referring to FIG. 5B, wherein the hollow area 61 is corresponding to the to-be-shaded area 53 of the mask 50.

Figure 5B:
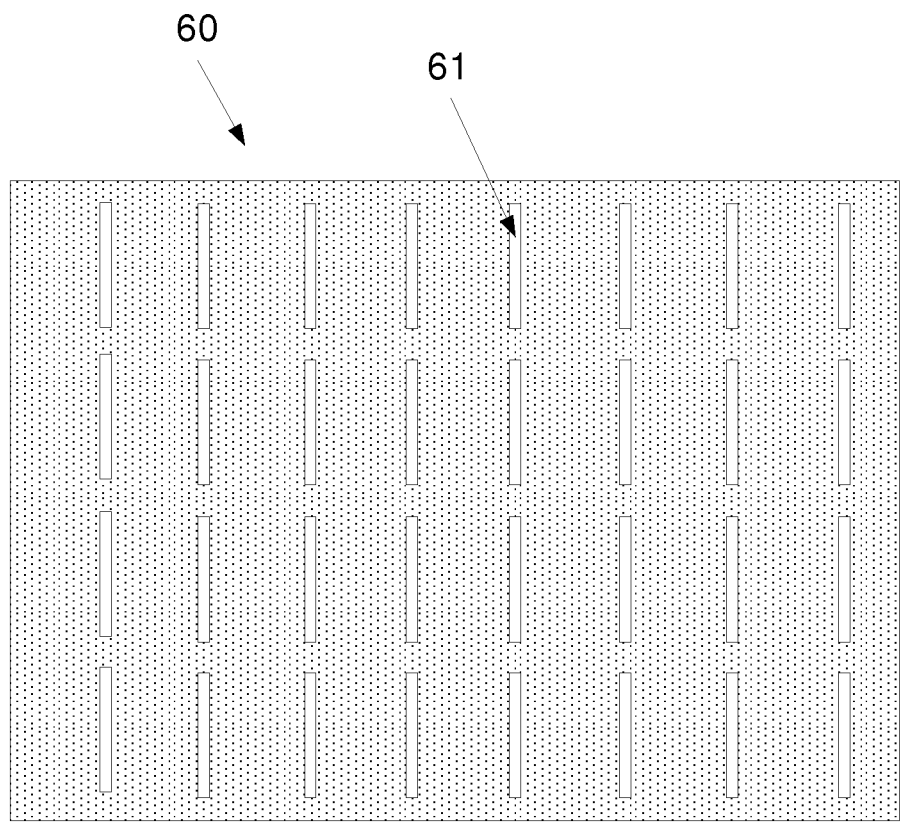
Figure 5C:
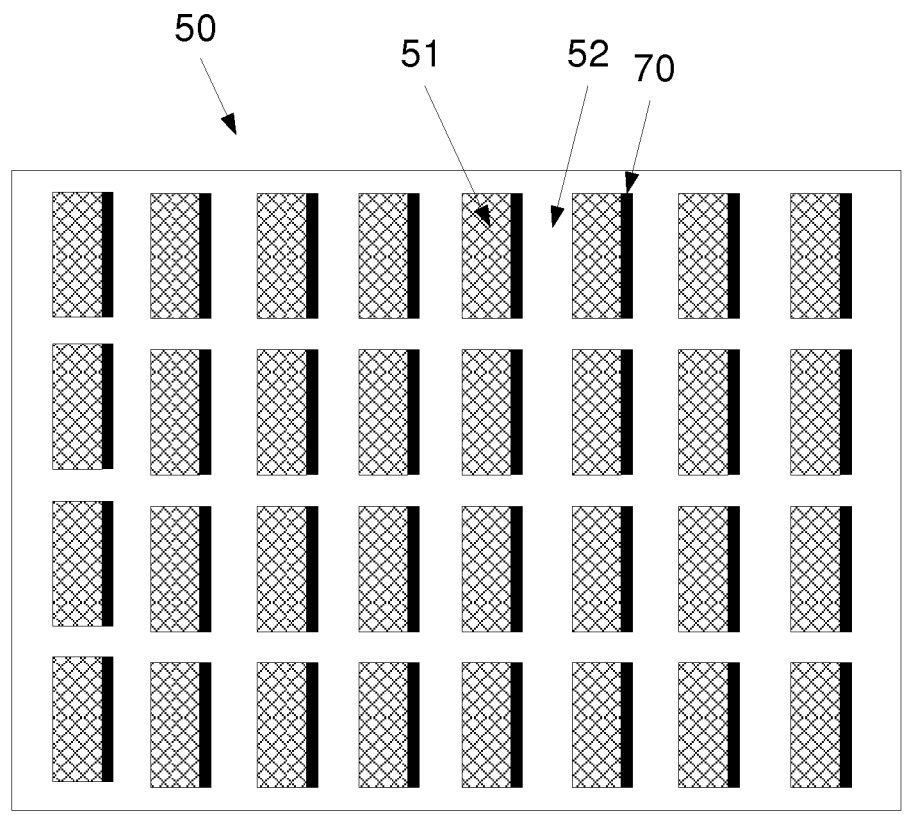

Subsequently, attaching the drillable member 60 formed with the expended hollow area 61 of the FIG. 5B onto the mask 50 of the FIG. 5A, so that the expended hollow area 61 of the drillable member 60 is aligned with the to-be-shaded area 53 of the mask 50. After this, coating a shading material onto the drillable member 60 having the expended hollow area 61, and finally removing the drillable member 60 formed with the expending hollow area 61, to form a shape of the FIG. 5C on the mask 50, wherein the shading material coated on the to-be-shaded area 53 forms a shaded layer 70.

Certainly, in one embodiment, when hollowing the drillable member 60, further forming alignment portions for alignment, as described above, but not described detailed herein.

Figure 6:
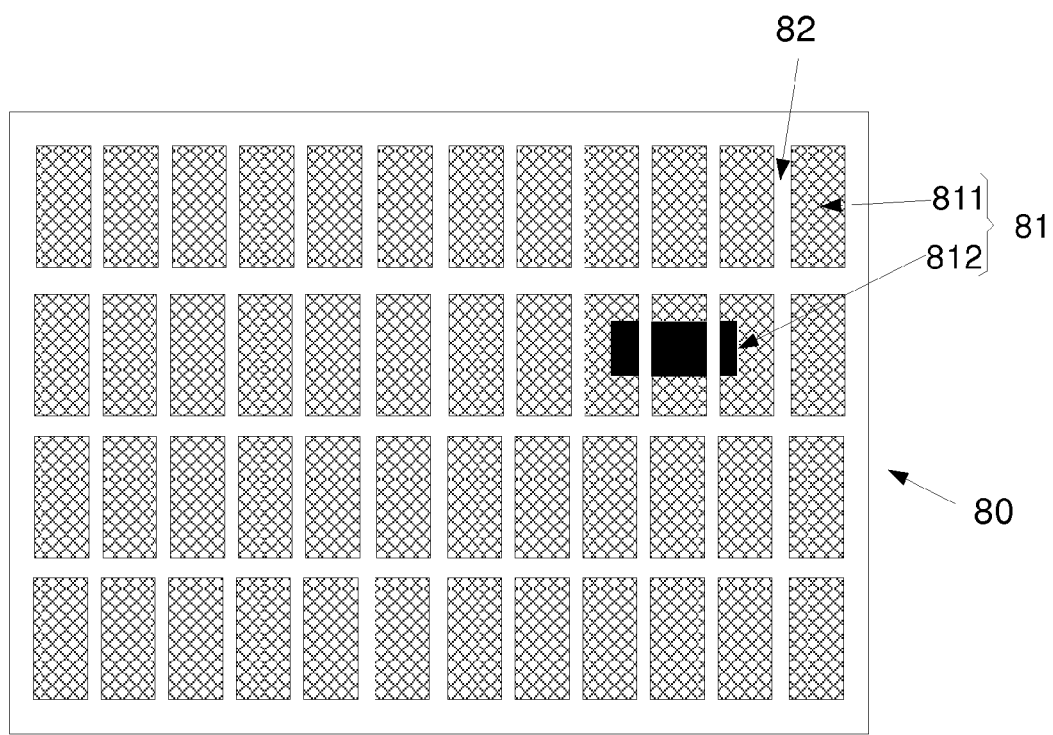
FIG. 6 is a structural schematic view of a mask according to a preferred embodiment of the present invention.

Referring to FIG. 6, FIG. 6 is a structural schematic view according to a preferred embodiment of the present invention.

The mask 80 comprises a shaded area 81 and a transparent area 82, wherein the shaded area 81 comprises a first shaded area 811 and a second shaded area 812, wherein a shading material of the first shaded area 811 and a shading material of the second shaded area 812 are different, the shading material of the first shaded area 811 is chromium, the shading material of the second shaded area 812 is black ink which is a cheap material. And, the second shaded area 812 is formed after forming the first shaded area 811. For example, referring to the schematic views of repairing the mask as shown in FIGS. 4A to 4I but not described detailed herein.

The mask of the present invention comprises a to-be-shaded area, for example, the to-be-shaded area is a to-be-repaired flaw or a to-be-expanded shaded area, the present invention forms a hollow area on the drillable member by enlarging a pattern of the mask template corresponding to the to-be-shaded area onto the drillable member, wherein the hollow area is corresponding to the to-be-shaded area of the mask; the drillable member is then attached onto the mask, so that the hollow area is corresponding to the to-be-shaded area of the mask; and a shading material is coated onto the drillable member, so that the shading material is filled into the to-be-shaded area to form a shaded layer on the to-be-shaded area Apparently, the present invention provides lower price, shorter repairing period, and higher efficiency of repairing.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A repairing method for a mask, the method comprising steps of:
   providing a drillable member, a mask, a mask template, a print board and a photoresist layer, wherein the mask comprises a to-be-shaded area, the mask template comprises a configuration pattern, the shape of the configuration pattern is the same as the shape of a mask pattern of the mask before forming the to-be-shaded area;
   selecting a reference area in the configuration pattern of the mask template, the reference area being corresponding to the to-be-shaded area of the mask; forming a printed area on the print board according to the selected reference area of the mask template, a pattern shape of the printed area being the same as that of the reference area, and the printed area having the same proportion as the mask pattern of mask; attaching the print board to the drillable member, and imprinting the printed area onto the drillable member to form a repair area on the drillable member, and a pattern of the repair area having the same proportion as the mask pattern of the mask;
   forming a hollow area by hollowing the repair area of the drillable member, wherein the hollow area is corresponding to the to-be-shaded area of the mask;
   attaching the drillable member having the hollow area onto the mask, wherein the hollow area is corresponding to the to-be-shaded area;
   coating a shading material onto the drillable member having the hollow area, so as to form a shaded layer on the to-be-shaded layer; and
   exposing a photoresist layer by the mask having the shaded layer, and developing the photoresist layer; and checking if the photoresist layer corresponding to the shaded layer is etched; if the photoresist layer corresponding to the shaded layer is etched, returning to repair the mask.

2. The repairing method for the mask according to claim 1, wherein after providing the mask having the to-be-shaded area, the method further comprises steps of:
   selecting positioning areas in the to-be-shaded area:
   wherein when forming the hollow area by hollowing the repair area of the drillable member, further comprising:
   forming alignment portions on the drillable member, wherein the alignment portions are corresponding to the positioning areas of the mask;
   wherein when attaching the drillable member having the hollow area onto the mask, further comprising:
   aligning the alignment portions of the drillable member with the positioning areas of the mask, so that the hollow area of the drillable member is aligned with the to-be-shaded area of the mask.

3. The repairing method for the mask according to claim 2, wherein the mask is formed with four of the positioning areas which defines a square area, and the four positioning areas are located at four corners of the square area, respectively;
   wherein the drillable member is square, the drillable member is formed with four of the alignment portions, and the four alignment portions are located at four corners of the drillable member; and
   when the alignment portions of the drillable member are aligned with the positioning areas of the mask, the alignment portions and the positioning areas are positioned by light and a magnifying glass.

4. The repairing method for the mask according to claim 1, wherein the shading material is black ink.

5. The repairing method for the mask according to claim 1, wherein the to-be-shaded area is a to-be-repaired flaw on the mask.

6. The repairing method for the mask according to claim 1, wherein the to-be-shaded area is a to-be-expanded shaded area on the mask.

7. A repairing method for a mask, the method comprising steps of:
   providing a drillable member, a mask and a mask template, wherein the mask comprises a to-be-shaded area, the mask template comprises a configuration pattern, the shape of the configuration pattern is the same as the shape of a mask pattern of the mask before forming the to-be-shaded area;

selecting a reference area in the configuration pattern of the mask template, the reference area being corresponding to the to-be-shaded area of the mask; and forming a repair area on the drillable member according to a pattern of the reference area, a pattern of the repair area having the same proportion as the mask pattern of mask;

forming a hollow area by hollowing the repair area of the drillable member, wherein the hollow area is corresponding to the to-be-shaded area of the mask;

attaching the drillable member having the hollow area onto the mask, wherein the hollow area is corresponding to the to-be-shaded area; and coating a shading material onto the drillable member having the hollow area, so as to form a shaded layer on the to-be-shaded layer.

8. The repairing method for the mask according to claim 7, wherein the step of forming the repair area on the drillable member according to the pattern of the reference area, the method further comprises steps of:

providing a print board;

forming a printed area on the print board according to the selected reference area of the mask template, a pattern shape of the printed area being the same as that of the reference area, and the printed area having the same proportion as the mask pattern of mask; and attaching the print board onto the drillable member, and imprinting the printed area onto the drillable member to form the repair area on the drillable member.

9. The repairing method for the mask according to claim 7, wherein after providing the mask having the to-be-shaded area, the method further comprises steps of:

selecting positioning areas in the to-be-shaded area:

wherein when forming the hollow area by hollowing the repair area of the drillable member, further comprising:

forming alignment portions on the drillable member, wherein the alignment portions are corresponding to the positioning areas of the mask; and wherein when attaching the drillable member having the hollow area onto the mask, further comprising:

aligning the alignment portions of the drillable member with the positioning areas of the mask, so that the hollow area of the drillable member is aligned with the to-be-shaded area of the mask.

10. The repairing method for the mask according to claim 9, wherein the mask is formed with four of the positioning areas which defines a square area, and the four positioning areas are located at four corners of the square area, respectively;

wherein the drillable member is square, the drillable member is formed with four of the alignment portions, and the four alignment portions are located at four corners of the drillable member; and when the alignment portions of the drillable member are aligned with the positioning areas of the mask, the alignment portions and the positioning areas are positioned by light and a magnifying glass.

11. The repairing method for the mask according to claim 7, wherein the shading material is black ink.

12. The repairing method for the mask according to claim 7, wherein the to-be-shaded area is a to-be-repaired flaw on the mask.

13. The repairing method for the mask according to claim 7, wherein the to-be-shaded area is a to-be-expanded shaded area on the mask.

14. The repairing method for the mask according to claim 7, wherein after coating the shading material onto the drillable member to form the shaded layer, the method further comprises steps of:

providing a photoresist layer;

exposing a photoresist layer by the mask having the shaded layer, and developing the photoresist layer; and checking if the photoresist layer corresponding to the shaded layer is etched; if the photoresist layer corresponding to the shaded layer is etched, returning to repair the mask.

\* \* \* \* \*